(12) United States Patent
Zhang et al.

(10) Patent No.: US 11,442,295 B2
(45) Date of Patent: Sep. 13, 2022

(54) HIGH-ELECTRON MOBILITY TRANSISTOR TERAHERTZ WAVE MODULATOR LOADED IN WAVEGUIDE

(71) Applicant: University of Electronic Science and Technology of China, Sichuan (CN)

(72) Inventors: Yaxin Zhang, Sichuan (CN); Shixiong Liang, Sichuan (CN); Xilin Zhang, Sichuan (CN); Ziqiang Yang Yang, Sichuan (CN); Zhihong Feng, Sichuan (CN)

(73) Assignee: University of Electronic Science and Technology of China, Sichuan (CN)

( * ) Notice: Subject to any disclaimer, the term of this patent is extended or adjusted under 35 U.S.C. 154(b) by 241 days.

(21) Appl. No.: 16/858,750

(22) Filed: Apr. 27, 2020

(65) Prior Publication Data
US 2020/0259235 A1    Aug. 13, 2020

(30) Foreign Application Priority Data

Apr. 29, 2019  (CN) .......................... 201910352955.6

(51) Int. Cl.
| | |
|---|---|
| *G02F 1/025* | (2006.01) |
| *G02F 1/00* | (2006.01) |
| *H01Q 13/20* | (2006.01) |
| *H04B 10/90* | (2013.01) |
| *H03C 7/02* | (2006.01) |
| *H01P 3/12* | (2006.01) |
| *H04B 10/50* | (2013.01) |

(52) U.S. Cl.
CPC ............ *G02F 1/025* (2013.01); *G02F 1/0081* (2013.01); *H01P 3/12* (2013.01); *H01Q 13/20* (2013.01); *H03C 7/025* (2013.01); *H04B 10/501* (2013.01); *H04B 10/90* (2013.01); *G02F 2203/13* (2013.01)

(58) Field of Classification Search
CPC ...... G02F 2203/13; G02F 1/015; G02F 1/025; H04B 10/90; H04B 10/501; H03C 7/025; H01P 3/12; H01P 7/06
See application file for complete search history.

(56) References Cited

U.S. PATENT DOCUMENTS

2016/0233962 A1\* 8/2016 Zhang ................... H04B 10/90

OTHER PUBLICATIONS

Otter, William J., and Stepan Lucyszyn. "Hybrid 3-D-printing technology for tunable THz applications." Proceedings of the IEEE 105.4 (2016): 756-767. (Year: 2016).\*

(Continued)

*Primary Examiner* — Ryan Johnson

(57) ABSTRACT

A high-electron mobility transistor (HEMT) array terahertz wave modulator loaded in a waveguide is provided, which belongs to the technical field of electromagnetic functional devices and focuses on fast dynamic functional devices in the terahertz band. The device comprises a waveguide cavity and a modulation chip. The modulation chip comprises a semiconductor material substrate, a heterostructure material epitaxial layer, an artificial microstructure, and a socket circuit. The applied voltage controls the distribution change of the two-dimensional electron gas in the HEMT, which in turn controls the resonance mode conversion in the artificial microstructure, thereby control the transmission of electromagnetic waves in the waveguide. The modulator has a modulation depth of up to 96% and a modulation rate above 2 GHz.

9 Claims, 6 Drawing Sheets

(56) References Cited

OTHER PUBLICATIONS

Singh, P. K., and S. Sonkusale. "High speed terahertz modulator on the chip based on tunable terahertz slot waveguide." Scientific reports 7.1 (2017): 1-8. (Year: 2017).*

* cited by examiner

HIGH-ELECTRON MOBILITY TRANSISTOR TERAHERTZ WAVE MODULATOR LOADED IN WAVEGUIDE

CROSS REFERENCE OF RELATED APPLICATION

The present application claims priority under 35 U.S.C. 119(a-d) to CN2019103529556, filed Apr. 29, 2019.

BACKGROUND OF THE PRESENT INVENTION

Field of Invention

The present invention relates to the technical field of electromagnetic functional devices, and more particularly to the field of communication devices including modulators, filters, electronically controlled switches, etc., focusing on fast dynamic functional devices in a terahertz band.

Description of Related Arts

Terahertz (THz) wave is a new type of electromagnetic spectrum belongs to the fields between photonics and electronics, which usually refers to electromagnetic radiation with a frequency between 0.1 THz and 10 THz. In recent years, thanks to the rapid development of terahertz sources and detection technologies, terahertz wave-based imaging, spectrum analysis, electronic information, radar positioning and other technical fields have shown great application prospects. At the same time, terahertz wireless communication technology, as one of the important directions in the terahertz field, is currently receiving attention from all countries in the world. As a wireless communication carrier, terahertz wave has ultra-high bandwidth, good penetration ability (compared to infrared and optical communication) and excellent directivity. The ultra-high bandwidth makes terahertz waves attract much attention in civil and national defense fields such as ultra-wideband communications, large-capacity wireless data transmission, and secure communications. Because the wavelength of terahertz waves is between 0.03 mm and 3 mm, it has good penetration Ability to maintain short-distance broadband communication in dense smoke and sand environments; the terahertz wave has a relatively small divergence angle and excellent directivity, so it has a small in satellite point-to-point communication, short-range atmospheric communication and ground point-to-point communication The power loss of the system can realize the point-to-point communication with large capacity.

As terahertz application systems with important application prospects, such as terahertz wireless communication systems and terahertz spectrum imaging systems, terahertz modulation devices are undoubtedly one of its key core devices, so terahertz modulation devices have also become terahertz science and technology Recognized research focus and technical difficulties in the field. Since 2004, many articles on terahertz wave external modulators have been published in Nature/Science and other top international journals of natural sciences. The content includes articles based on doped silicon, gallium arsenide, phase change materials and graphene. Combined with artificial microstructure, the use of external temperature, light, electric field and other excitation methods to achieve the modulation of terahertz waves, and partially solved the problem of terahertz wave amplitude modulation. However, the conventional terahertz wave modulators often use artificial microstructures with large area arrays, and the array contains hundreds of modulation units. Excessive number of cells not only introduces huge parasitic capacitance and inductance into the device, but also induces parasitic patterns between the cells, and increases the difficulty of matching circuits of the modulation array, which makes the modulation signal not capable of effectively feeding into the modulation array and makes it difficult to increase the modulation rate of the modulator. In addition, the modulation method of the external space corresponding to the artificial microstructure of the large-area array makes the terahertz waves easily interfered by external factors during the modulation process. Therefore, research on high-performance terahertz modulator is rarely reported, the highest modulation rate is generally only 100 MHz. How to achieve high-efficiency and high-speed modulation of amplitude has become a bottleneck in this research field. The breakthrough of this technology and the successful development of this device will greatly reduce the difficulty of parasitic parameters and circuit matching in artificial microstructures and suppress parasitic modes, thereby greatly increasing the transmission rate and the signal-to-noise ratio of terahertz wireless communication systems based on direct modulation, reduce the bit error rate, reduce the difficulty of data processing at the receiving end of the communication, which will be more conducive to the realization and industrialization of terahertz high-performance systems.

High Electron Mobility Transistor (HEMT) is a new type of field effect transistor that uses two-dimensional electron gas (2-DEG) existing in modulated doped heterojunction to operate. In 1978, R. Dingle first observed high electron mobility in a modulated doped GaAs/AlGaAs superlattice grown in MBE (Molecular Beam Epitaxy). In 1980, Mimura of Fujitsu Corporation of Japan developed HEMT and successfully applied it to microwave low-noise amplification. In recent years, with the development of semiconductor materials and technologies, high electron mobility transistors have demonstrated excellent performance and have been successfully applied to detectors, amplifiers and other fields. The emergence of HEMT has provided new developments for THz fast response dynamic devices ideas. The third-generation wide band gap semiconductor material GaN not only has a wide gap, but also has the characteristics of large thermal conductivity, high electron saturation rate, strong breakdown field and good thermal stability. Therefore, in the preparation of high-speed functional devices, HEMT based on GaN material has great advantages.

SUMMARY OF THE PRESENT INVENTION

The technical problem to be solved by the present invention is to design a terahertz wave modulator that is directly controlled by an external voltage and is loaded inside the cavity, which can effectively control the transmission mode of the terahertz wave in the waveguide within the operating frequency band, and has a high Modulation efficiency and modulation rate above 2 GHz. At the same time, the device must also have a high working stability, not easily interfered by the external environment.

The technical solution adopted by the present invention to solve the problem is to use a micro-fabrication process to nest HEMT into an artificial microstructure containing very few modulation units, prepare a terahertz wave modulation chip, and use an external electrical signal to change the HEMT. The concentration of 2-DEG in the medium controls the conversion of the electromagnetic resonance mode in the artificial microstructure, which can greatly reduce the parasitic parameters of the modulation chip, effectively suppress the formation of parasitic modes, simplify the matching circuit and greatly improve the modulation efficiency of the device. At the same time, the modulation chip is loaded into the waveguide cavity, and the transmission of the terahertz wave in the waveguide is controlled by the conversion of the electromagnetic resonance mode in the artificial microstructure. Since the 2-DEG in the GaN-based HEMT has extremely high electron mobility, the modulator can obtain high modulation rate. At the same time, the reduction of parasitic parameters in the modulation chip allows the high-frequency characteristics of HEMT to be exerted normally, thereby further improving the modulation rate of the device, and finally achieving a modulation rate above 2 GHz. In addition, the form of the device loaded in the cavity makes the modulation chip effectively protected by the metal waveguide, can effectively resist the interference of external factors, and greatly enhances the stability of the device.

Therefore, the invention provides a terahertz wave modulator of a high electron mobility transistor array loaded in a waveguide. The modulator includes a rectangular waveguide cavity and a modulation chip. The wall of the rectangular waveguide cavity is made of metal, and the waveguide cavity has two waveguide ports: the input waveguide port and the output waveguide port. The modulation chip is embedded in the rectangular waveguide, erected in the waveguide cavity and parallel to the waveguide opening. The chip structure includes a semiconductor substrate, a heterostructure epitaxial layer disposed on the semiconductor substrate, and an artificial microstructure disposed on the epitaxial layer. The artificial microstructure includes a modulation unit array and a socket circuit. Each modulation unit in the modulation unit array includes: a source resonator, a drain resonator, a gate connection line, and a semiconductor doped heterostructure. The source resonator and the drain resonator have the same I-shaped structure, and the two are symmetrically arranged on both sides of the gate connection line, and each has a mirror image structure. The lateral long branches of the I-shaped structure of adjacent source resonators are connected to each other, and the lateral long branches of the I-shaped structure of adjacent drain resonators are connected to each other. The gate lines are arranged above the semiconductor doped heterostructure, and the gate connection lines of adjacent modulation units are connected to each other. The semiconductor doped heterostructure is connected to the lateral short branch of the I-shaped structure of the source resonator and the drain resonator, and the semiconductor doped heterostructure is provided to the lateral short branch of the I-shaped structure of the source resonator and the drain resonator Below. The socket circuit includes a positive voltage loading electrode and a negative voltage loading electrode. The positive voltage loading electrode and the negative voltage loading electrode are both longitudinally arranged metal strips, the positive voltage loading electrode is connected to the horizontal long branch of the I-shaped structure of the source resonator and the drain resonator, and the negative voltage loading electrode is connected to the modulation unit The gate connection line is connected.

Further, the longitudinal width of the modulation chip is the same as the longitudinal width of the waveguide port, and the lateral width of the modulation chip is longer than the lateral width of the waveguide port.

Further, one side of the artificial microstructure of the modulation chip faces the input waveguide port and a gap is left with the metal cavity wall, and the side of the semiconductor substrate of the modulation chip faces the output waveguide port and is in contact with the metal cavity wall.

Further, at the junction of the longitudinal left and right side walls of the waveguide and the modulation chip, each has an opening of the same size, the longitudinal height of the opening is the same as the longitudinal height of the chip, and the lateral width of the opening is longer than the thickness of the chip.

Further, the lateral short branches in the I-shaped structure of the source resonator and the drain resonator are connected to the semiconductor doped heterostructure through an ohmic contact electrode.

Further, a portion of the gate connection line located in the doped heterostructure is narrower than other portions.

Further, the modulation array is an M*N type array composed of a plurality of modulation units, M represents the number of rows of the modulation array, and N represents the number of modulation units in each row, where M≥1 and N≥1.

The metal material of the waveguide cavity wall is oxygen-free copper, brass or aluminum.

The material of the ohmic contact electrode is Ti, Al, Ni or Au.

The semiconductor substrate may be selected from sapphire, quartz, silicon carbide, and other material media with low insertion loss for terahertz waves.

The artificial microstructure can generally use high conductivity metal materials such as Al, Ag, and Au.

The material of the doped heterojunction structure is AlGaN/GaN, InGaN/GaN, AlGaAs/GaAs, AlGaAs/InGaAs or AlGaAs/InGaAs/InP, where the diagonal line indicates the combination of the two materials.

The beneficial effects of the present invention are: (1) In this invention, the artificial microstructure on the modulation chip no longer adopts the large area array design, and the number of modulation units is greatly reduced to a few, which originally existed in the parasitic structure of the large area array The mode is effectively suppressed, which is beneficial to the high-frequency characteristics of HEMT in the chip, thereby improving the modulation rate of the device. (2) In this invention, the number of rows of the modulation array in the modulation chip is greatly reduced to one row, the modulation units are connected in series in the form of parallel circuits, and the source and drain resonators of all the modulation units are connected to the same electrode For feeding, these designs simplify the circuit of the modulation chip, reduce the difficulty of circuit impedance matching, and at the same time reduce the parasitic parameters in the modulation array, which is beneficial to the efficient feeding of the modulation signal and improve the modulation depth and modulation rate of the device. (3) The invention adopts a symmetrical double "T" structure as the resonance unit of the artificial microstructure. The structure is simple, and the corresponding dipole resonance is easy to adjust, which further reduces the parasitic capacitance and parasitic inductance attached to the resonance structure itself. It is beneficial to increase the modulation depth and increase the modulation rate. (4) The HEMT as a control switch is organically combined with a nested design and a resonance unit. The ohmic contact electrode of the high electron mobility transistor and the source/drain resonator are seamlessly overlapped, completely eliminating the transistor electrode pair Resonance mode interference. (5) The modulation array formed by artificial microstructure design in the present invention is a two-dimensional planar structure, which can be realized by micro-machining means, the process is mature and easy to manufacture, avoiding the high difficulty brought by the design scheme of complex three-dimensional structure machining. (6) The device adopts the form of cavity loading, the modulation chip is embedded in the waveguide cavity to be effectively protected, and it can resist the interference of external factors such as smoke and dust. The device can work at normal temperature, normal pressure and non-vacuum Under the conditions, it has good working stability. (7) The design of the present invention is a transmissive terahertz wave modulator. The terahertz wave is confined to be transmitted in the waveguide. Compared with regulating the terahertz wave diverging in free space, the modulation efficiency of the modulation chip is easier to improve. (8) The modulator has a modulation depth of up to 96% and a modulation rate of more than 2 GHz. By connecting functional accessories such as a gain antenna to the waveguide port of the device, the device is easily integrated into the terahertz wireless communication system and terahertz radar imaging System, so the invention has extremely high practical value.

These and other objectives, features, and advantages of the present invention will become apparent from the following detailed description, the accompanying drawings, and the appended claims.

Figure 1:
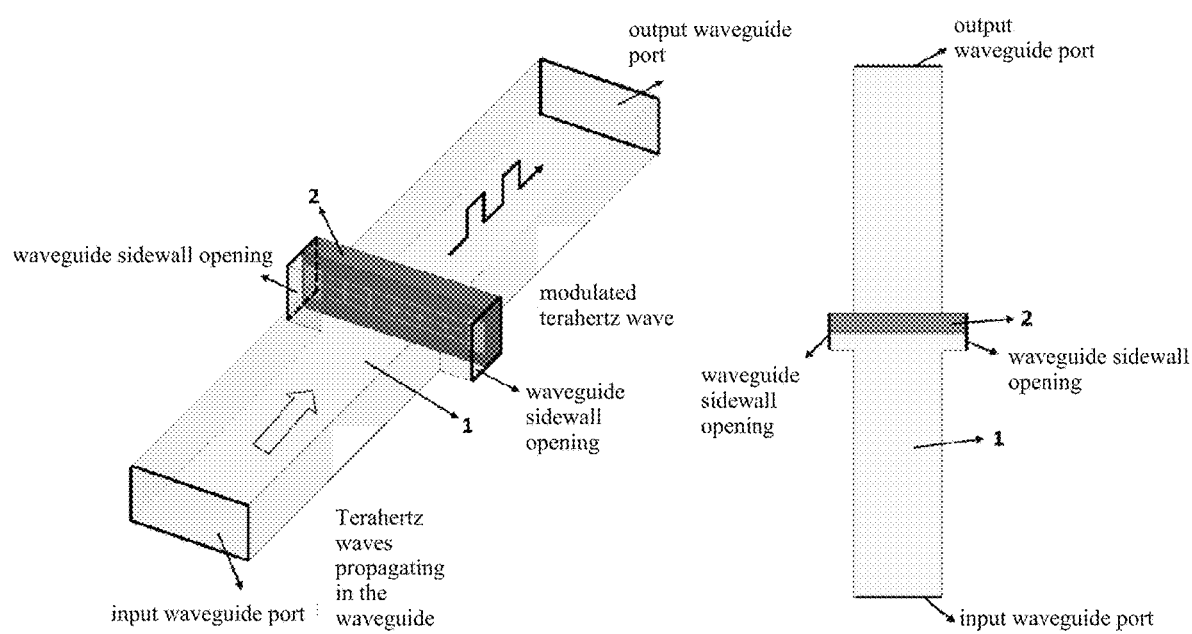
FIG. 1 is a schematic diagram of the overall design of a waveguide loaded HEMT terahertz wave modulator.

In the drawings: 1—rectangular waveguide cavity, 2—odulation chip, 3—semiconductor substrate, 4—epitaxial layer, 5—negative voltage loading electrode, 6—positive voltage loading electrode, 7—modulation cell array, 8—source Resonator, 9—drain resonator, 10—gate connection line, 11—ohmic contact electrode, 12—semiconductor doped heterostructure.

DETAILED DESCRIPTION OF THE PREFERRED EMBODIMENT

In the present invention, a modulation chip is prepared by nesting a HEMT in an artificial microstructure, and the modulation chip is loaded into a waveguide cavity, and an external electrical signal is used to change the concentration of 2-DEG in the HEMT, and control the electromagnetic resonance mode in the artificial microstructure Conversion, thereby regulating the transmission of terahertz waves in the waveguide. The simulation calculation shows that it has high modulation efficiency and large modulation depth, and proves that it has extremely high modulation rate in the experiment.

Figure 2:
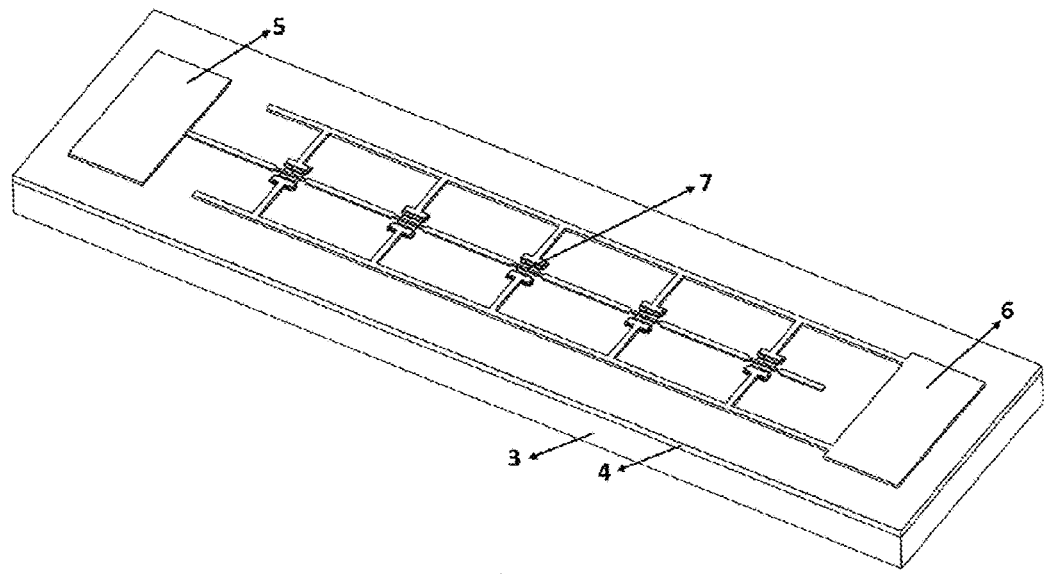
FIG. 2 is a perspective schematic view of a modulation chip in a waveguide-loaded HEMT terahertz wave modulator.
Figure 3:
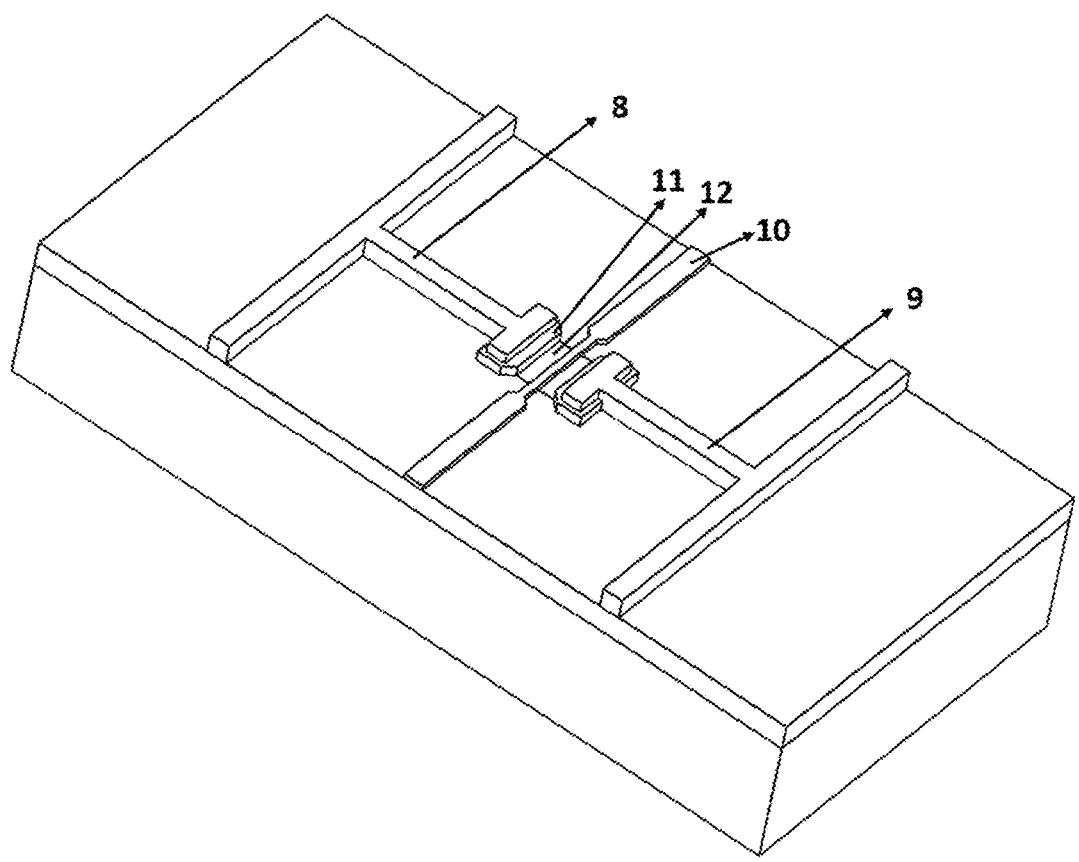
FIG. 3 is a perspective schematic view of a modulation unit on a modulation chip in a waveguide-loaded HEMT terahertz wave modulator.
Figure 4:
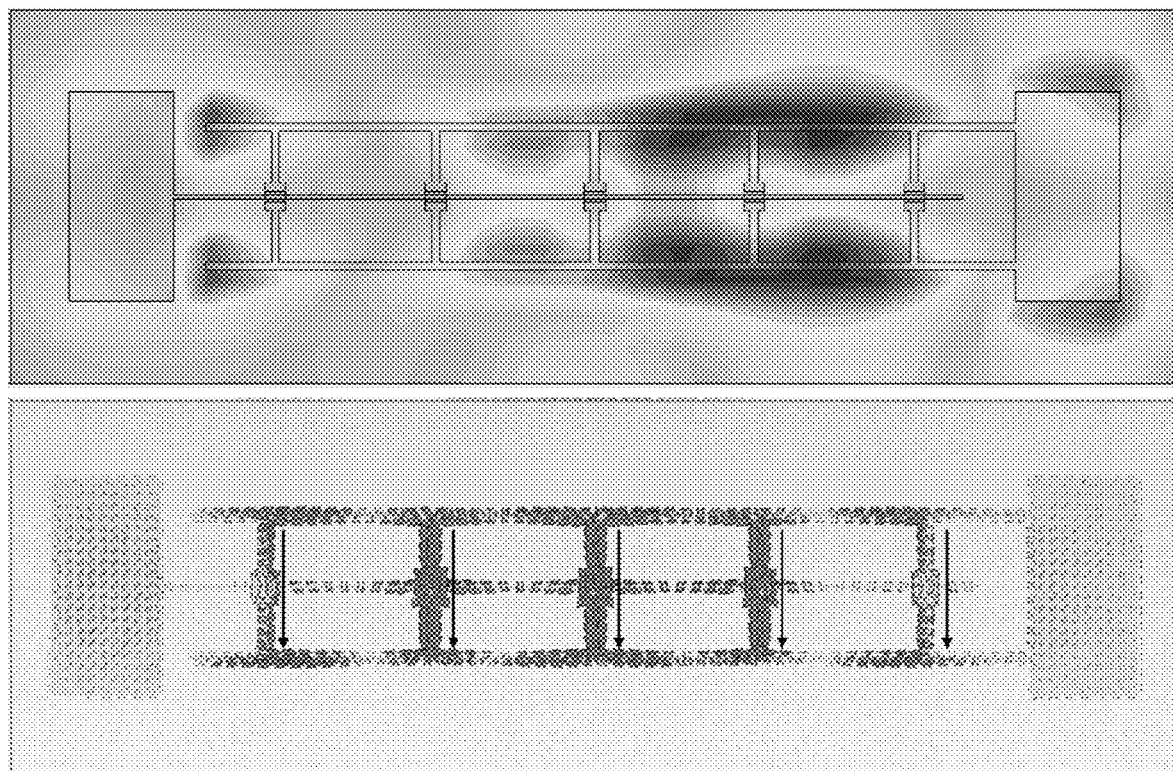
FIG. 4 is a schematic diagram of the electric field and surface current distribution of the modulation array when no electrical excitation is applied.

Referring to FIGS. 1-3, the invention comprises a rectangular waveguide cavity (1) and a modulation chip (2). The modulation chip (2) includes a semiconductor substrate (3), a heterostructure epitaxial layer (4), a modulation array (7), a positive voltage loading electrode (6), and a negative voltage loading electrode (5). The positive voltage loading electrode (6), the negative voltage loading electrode (5) and the modulation array (7) constitute a metal structure layer, and an epitaxial layer (4) and a semiconductor material substrate (3) are sequentially arranged under the metal structure layer. The modulation unit array is an M*N array composed of a plurality of modulation units, M represents the number of rows of the modulation array, and N represents the number of modulation units in each row, where $M≥1$ and $N≥1$. The modulation unit includes a high electron mobility transistor and a metal resonance structure. Each modulation unit contains a high electron mobility transistor, each transistor is composed of a source of the ohmic contact electrode (11), a drain of the ohmic contact electrode (11), a gate line (10) and a semiconductor doped heterogeneous material (12), the transistor Located between the upper I-shaped structure and the lower I-shaped structure, and the horizontal short branches in the I-shaped structure are engraved on the source or drain of each transistor. The gate lines of the transistors are connected and connected to the electrode (5) is loaded with a negative voltage. The resonance structure in the modulation unit is composed of a source resonator (8) and a drain resonator (9). The source and drain resonators have the same structure, and they are all lying I-shaped structure, the upper I-shaped structure is a source resonator, the lower I-shaped structure is a drain resonator, and the upper and lower I-shaped structures are mirror images of the gate connection line located in the middle of the resonant structure. The horizontal direction of the I-shaped structure and the long branches are connected to each other and connected to a positive voltage loading electrode (6). The modulation chip (2) is embedded in a rectangular waveguide cavity (1), erected in the waveguide cavity and parallel to the waveguide port. The longitudinal width of the modulation chip and the longitudinal width of the waveguide port is the same, and the lateral width of the modulation chip is longer than the lateral width of the waveguide port. The side of the artificial microstructure of the modulation chip faces the input waveguide port and there is a gap with the metal cavity wall. A side of the semiconductor substrate of the modulation chip faces the output waveguide and is fixed on the wall of the metal cavity by applying conductive silver glue. The longitudinal left and right side walls of the waveguide are connected to the modulation chip, and each has a longitudinal height that is the same as the longitudinal height of the chip, and the lateral width is longer than the thickness of the chip. The opening is used for electrical connection between the external control circuit and the positive/negative voltage loading electrode on the chip.

The material of the waveguide cavity wall in the terahertz wave modulator of the high electron mobility transistor array loaded in the cavity of the present invention is oxygen-free copper, brass or aluminum. The modulation chip is a composite metal-semiconductor structure. In the above technical solution, the substrate (3) is a semiconductor material such as sapphire, high-resistance silicon, silicon carbide; the HEMT epitaxial layer (4) is a semiconductor that can constitute a heterojunction Materials, such as AlGaN/GaN, InGaN/GaN, AlGaAs/GaAs, etc. Generally, Ti, Al, Ni, Au, etc. are used to form the ohmic contact electrode (11), and Au, Ag, Al and other metal materials are used to form the resonant metal resonator (8), (9) and the socket circuit (5), (6) and the gate line (10). The metal materials listed above can also be replaced by other metals with similar characteristics.

Figure 5:
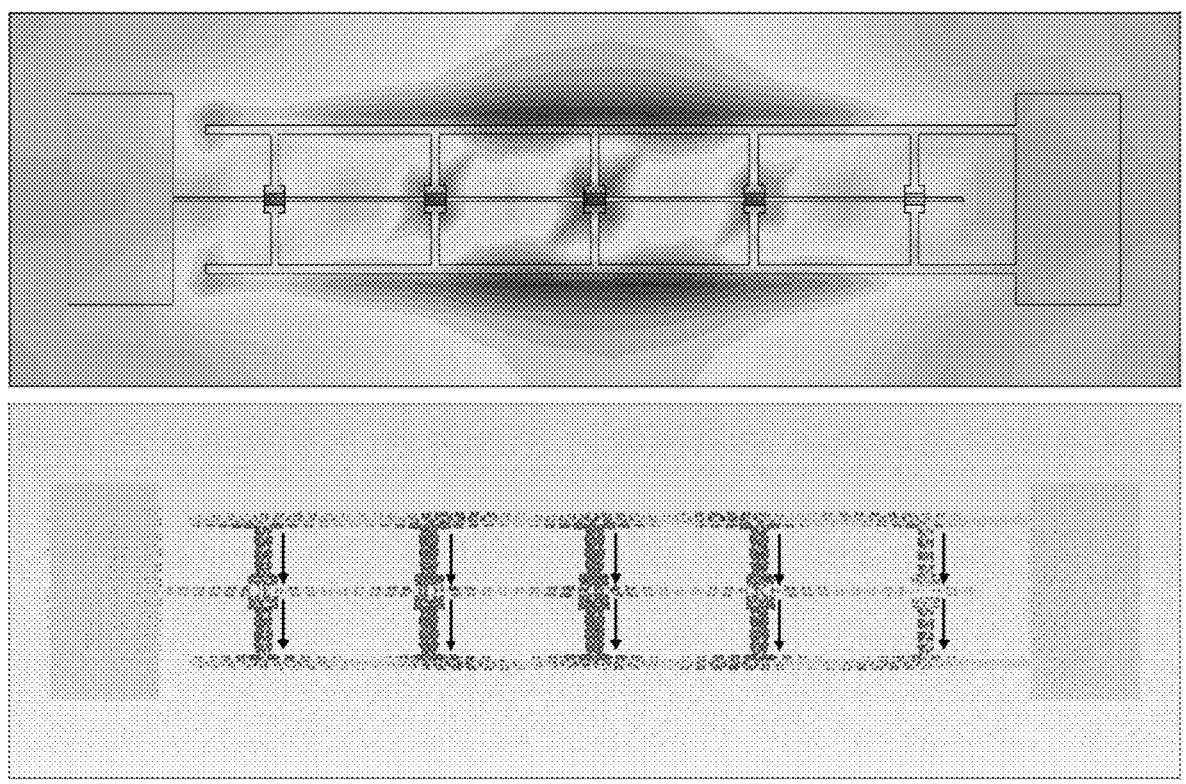
FIG. 5 is a schematic diagram of the electric field and surface current distribution of the modulation array when external electrical excitation is applied.
Figure 6:
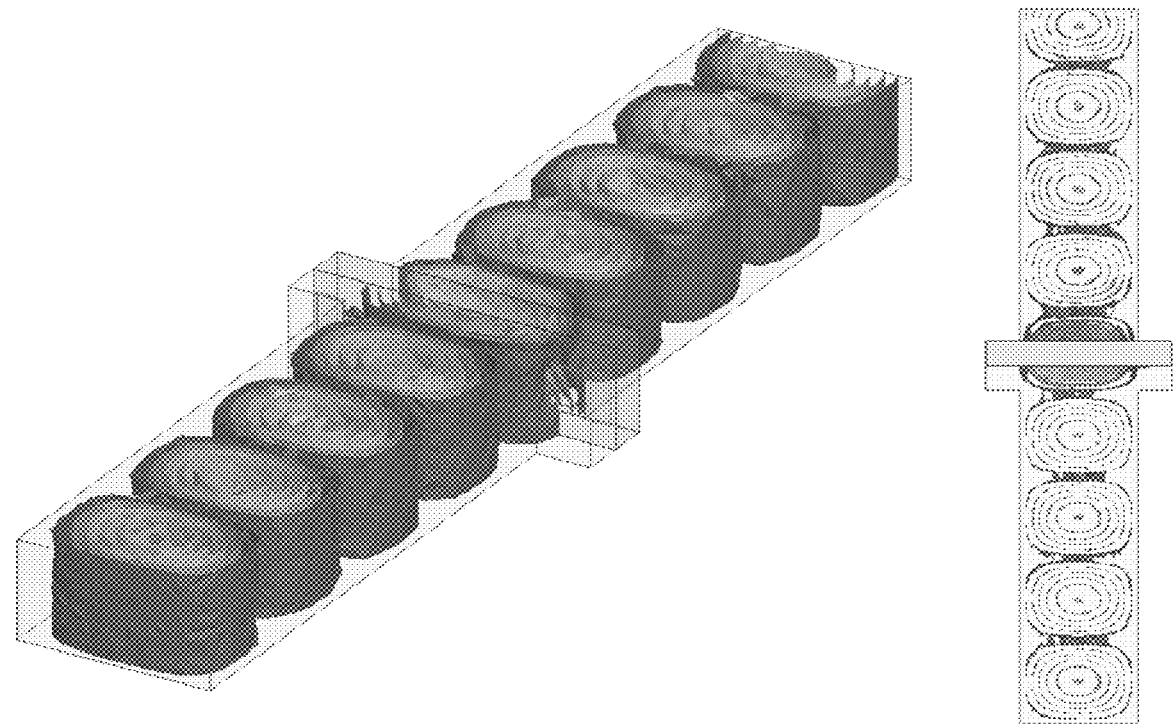
FIG. 6 is a schematic diagram of the electric field in the waveguide cavity of the modulator when no electrical excitation is applied.
Figure 7:
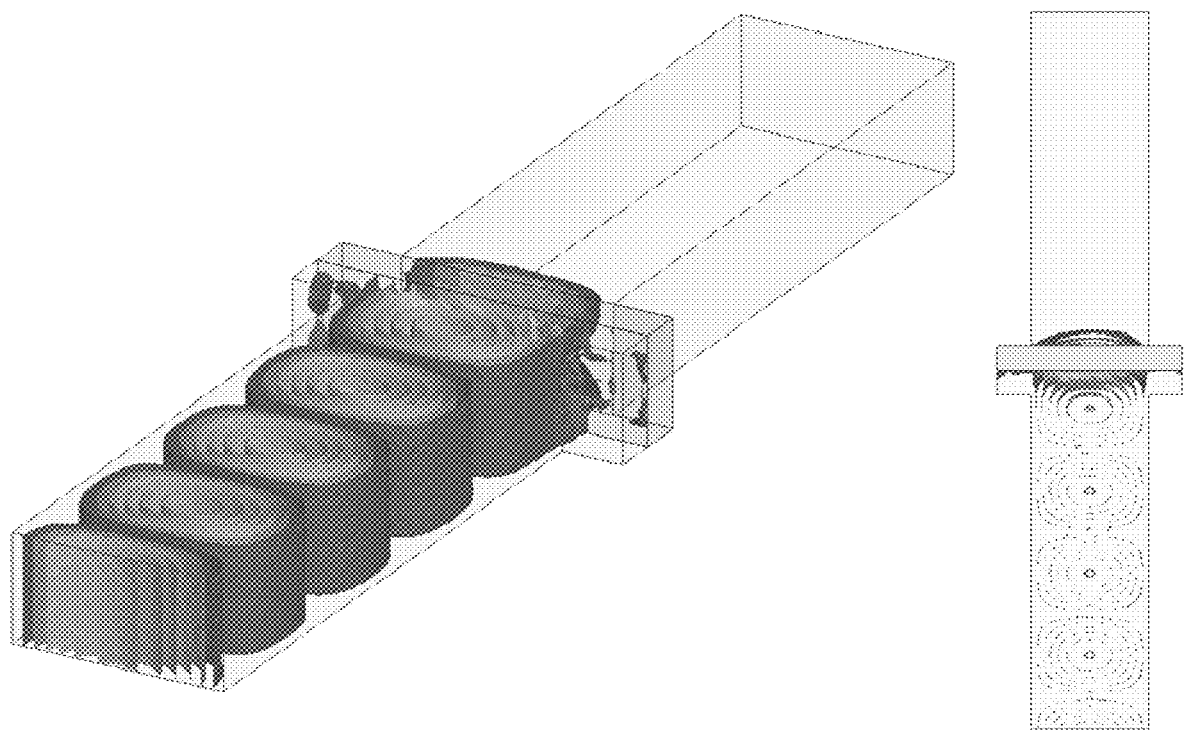
FIG. 7 is a schematic diagram of the electric field in the waveguide cavity of the modulator during external electrical excitation.
Figure 8:
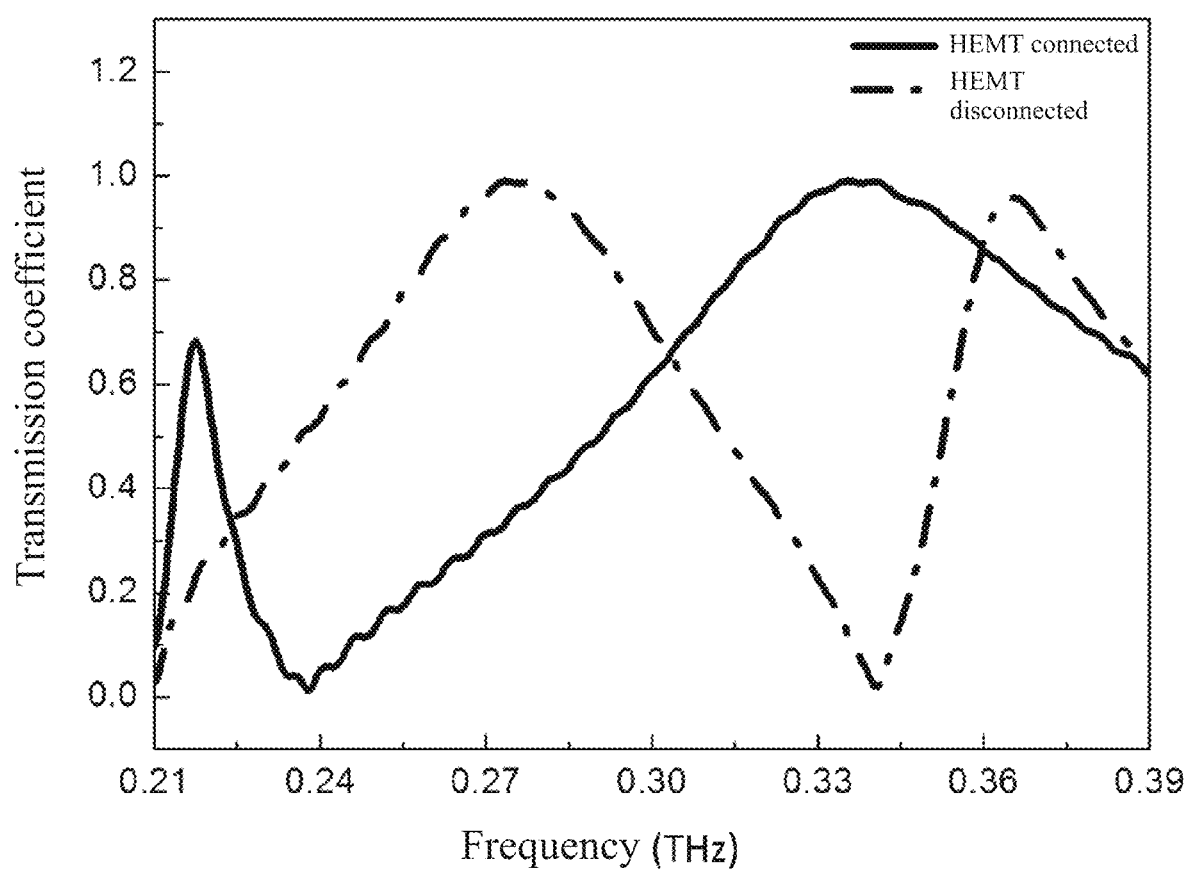
FIG. 8 is a simulation diagram of the transmission curve of a waveguide loaded HEMT terahertz wave modulator under electrical excitation of different intensities.

The modulation mechanism of the terahertz wave modulator loaded in the cavity is to change the distribution of the two-dimensional electron gas in the heterostructure by applying external electrical excitation, and control the conversion of the electromagnetic resonance mode in the artificial microstructure, which is composed of multiple resonance units The resonant array of the mobile terminal performs dynamic amplitude modulation on the terahertz waves transmitted in the waveguide. The specific modulation process is as follows: the negative voltage loading electrode connected to the gate in the modulator is loaded with negative voltage through the sidewall opening of the waveguide, and the positive voltage loading electrode connected to the source and drain is loaded with positive voltage through the sidewall opening. When the applied voltage difference is 0, the concentration of the two-dimensional electron gas in the heterojunction is maintained at a very high level. The source resonator and the drain resonator in the resonance unit are connected as a whole through 2-DEG. 4 It can be seen that the electric field is mainly distributed at the lateral long branches of the I-shaped structure, and the surface current flows through the longitudinal long rods of the mirror-symmetrical I-shaped structure, forming a dipole resonance that penetrates the source resonator and the drain resonator. As shown in FIG. 8, the resonance frequency of the structure is near 0.24 THz; when the applied voltage difference increases gradually, the two-dimensional electron gas concentration in the HEMT between the source and drain gradually decreases until it is exhausted, and the HEMT gradually changes from connected to a pinch-off state, it can be seen from the model in FIG. 5 that the electric field is mainly concentrated in the gap between the I-shaped structures, and the surface current penetrating through the source resonator and the drain resonator is divided into two, which becomes limited to The dipole resonance inside the source resonator and the drain resonator. As shown in FIG. 8, the resonance frequency of the structure at this time is 0.34 THz. In the above dynamic change process, the resonance mode shift causes the resonance frequency point to shift. As the applied voltage increases, the resonance peak gradually shifts from 0.24 THz to 0.34 THz. In the vicinity of 0.34 THz, when the applied voltage is 0, the transmission rate of the electromagnetic wave in the waveguide is as high as 0.95. As shown in FIG. 6, the terahertz wave fed from the input waveguide port can pass through the modulation chip and be output from the output waveguide port. The terahertz wave in the waveguide cavity is in the traveling wave state and has good transmission characteristics. When the applied voltage increases to reduce the transmission coefficient to 0.04, as shown in FIG. 7, the terahertz wave fed from the input waveguide port cannot pass through the modulation chip, and the terahertz wave in the waveguide cavity becomes a standing wave state. The amplitude modulation efficiency of the above dynamic modulation can reach 96%.

Figure 9:
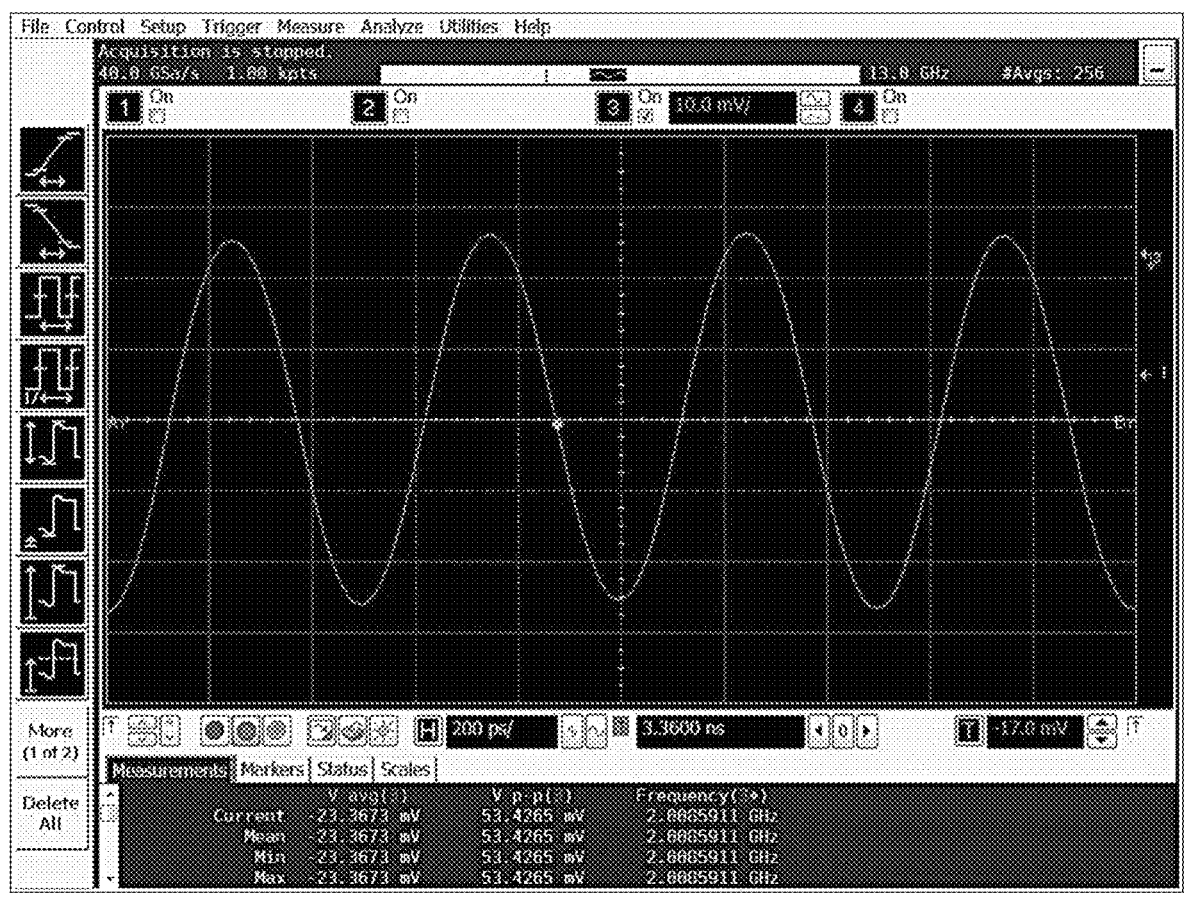
FIG. 9 is the modulation signal of the terahertz wave transmitted in the waveguide when the HEMT terahertz wave modulator loaded by the waveguide measured in the experiment is applied with a 2 GHz modulation voltage signal.

FIG. 9 shows the modulation signal loaded on the terahertz wave actually measured in the experiment after passing through the modulator. The modulation signal is 2 GHz. This result proves that the modulator can rapidly modulate the terahertz wave transmitted in the waveguide.

It should be noted that by changing the structural parameters of the resonant unit, such as the length of the branch of the I-shaped structure, the spacing of the resonant unit, etc., the resonant frequency of the modulator can be precisely controlled, and the device can be applied to different operating frequency bands.

In summary, the terahertz wave modulator of the high electron mobility transistor loaded in the cavity is a highly practical high-speed modulation device that works in the THz frequency band.

Although the embodiments of the present invention have been shown and described above, it can be understood that the above-mentioned embodiments are exemplary and cannot be construed as limitations to the present invention. For those of ordinary skill in the art, they do not deviate from this on the premise of the principle of the invention, several improvements and retouches can also be made, and these improvements and retouches should also be regarded as the protection scope of the present invention.

What is claimed is:

1. A terahertz wave modulator of a high electron mobility transistor loaded in a waveguide, comprising: a rectangular waveguide cavity and a modulation chip; wherein a wall of the rectangular waveguide cavity is made of metal, and the waveguide cavity has two waveguide ports: an input waveguide port and an output waveguide port; the modulation chip is embedded in the rectangular waveguide, erected in the waveguide cavity and parallel to the waveguide opening; the chip structure comprises a semiconductor substrate, a heterostructure epitaxial layer disposed on the semiconductor substrate, and an artificial microstructure disposed on the epitaxial layer; the artificial microstructure includes a modulation unit array and a socket circuit; each modulation unit in the modulation unit array comprises: a source resonator, a drain resonator, a gate connection line, and a semiconductor doped heterostructure; the source resonator and the drain resonator have the same I-shaped structure, and the two are symmetrically arranged on both sides of the gate connection line, and each has a mirror image structure; a lateral long branches of the I-shaped structure of adjacent source resonators are connected to each other, and the lateral long branches of the I-shaped structure of adjacent drain resonators are connected to each other; gate lines are arranged above the semiconductor doped heterostructure, and the gate connection lines of adjacent modulation units are connected to each other; the semiconductor doped heterostructure is connected to the lateral short branch of the I-shaped structure of the source resonator and the drain resonator, and the semiconductor doped heterostructure is provided to the lateral short branch of the I-shaped structure of the source resonator and the drain resonator below; the socket circuit comprises a positive voltage loading electrode and a negative voltage loading electrode; the positive voltage loading electrode and the negative voltage loading electrode are both longitudinally arranged metal strips, the positive voltage loading electrode is connected to the horizontal long branch of the I-shaped structure of the source resonator and the drain resonator, and the negative voltage loading electrode is connected to the gate connection line of the modulation unit.

2. The terahertz wave modulator of the high electron mobility transistor loaded in the waveguide, as recited in claim 1, wherein the longitudinal width of the modulation chip is the same as the longitudinal width of the waveguide port, and the lateral width of the modulation chip is longer than the lateral width of the waveguide port.

3. The terahertz wave modulator of the high electron mobility transistor loaded in the waveguide, as recited in claim 1, wherein a side of the artificial microstructure of the modulation chip faces the input waveguide port and a gap is left with the metal cavity wall, and the side of the semiconductor substrate of the modulation chip faces the output waveguide port and is connected to the metal cavity wall.

4. The terahertz wave modulator of the high electron mobility transistor loaded in the waveguide, as recited in claim 1, wherein at a junction of the longitudinal left and right side walls of the waveguide and the modulation chip, each has an opening of the same size; the longitudinal height of the opening is the same as the longitudinal height of the chip; and the lateral width of the opening is longer than the thickness of the chip.

5. The terahertz wave modulator of the high electron mobility transistor loaded in the waveguide, as recited in claim 1, wherein the lateral short branches in the I-shaped structure of the source resonator and the drain resonator are connected to the semiconductor doped heterostructure through an ohmic contact electrode.

6. The terahertz wave modulator of the high electron mobility transistor loaded in the waveguide, as recited in claim 1, wherein the modulation array is an M*N type array composed of multiple modulation units, M represents the number of rows of the modulation array, and N represents the number of modulation units in each row, where $M \geq 1$, $N \geq 1$.

7. The terahertz wave modulator of the high electron mobility transistor loaded in the waveguide, as recited in claim 1, wherein the metal material of the waveguide cavity wall is oxygen-free copper, brass or aluminum.

8. The terahertz wave modulator of the high electron mobility transistor loaded in the waveguide, as recited in claim 1, wherein a material of the ohmic contact electrode is Ti, Al, Ni or Au.

9. The terahertz wave modulator of the high electron mobility transistor loaded in the waveguide, as recited in claim 1, wherein the material of the doped heterojunction structure is AlGaN/GaN, InGaN/GaN, AlGaAs/GaAs, AlGaAs/InGaAs or AlGaAs/InGaAs/InP, wherein the diagonal line indicates the combination of the two materials.

* * * * *